(12) United States Patent
Ryding et al.

(10) Patent No.: US 7,872,247 B2
(45) Date of Patent: Jan. 18, 2011

(54) ION BEAM GUIDE TUBE

(75) Inventors: Geoffrey Ryding, Manchester, MA (US); Gregory Robert Alcott, Hampshire (GB); Lee Spraggon, East Sussex (GB); Robert Mitchell, West Sussex (GB); Martin Hilkene, Gilroy, CA (US); Matthew Castle, Morgan Hill, CA (US); Marvin Farley, Ipswich, MA (US)

(73) Assignee: Applied Materials, Inc., Santa Clara, CA (US)

( * ) Notice: Subject to any disclaimer, the term of this patent is extended or adjusted under 35 U.S.C. 154(b) by 401 days.

(21) Appl. No.: 11/907,403

(22) Filed: Oct. 11, 2007

(65) Prior Publication Data
US 2009/0095916 A1  Apr. 16, 2009

(51) Int. Cl.
*H01J 37/317* (2006.01)
*H01L 21/265* (2006.01)

(52) U.S. Cl. .............................. 250/492.21; 250/423 R; 250/492.2; 315/111.81

(58) Field of Classification Search ............ 250/492.21, 250/492.2, 423 R; 315/111.81
See application file for complete search history.

(56) References Cited

U.S. PATENT DOCUMENTS

| 5,399,871 | A |   | 3/1995  | Ito et al.     |            |
|-----------|---|---|---------|----------------|------------|
| 5,925,886 | A | * | 7/1999  | Seki et al.    | 250/492.21 |
| 5,969,366 | A | * | 10/1999 | England et al. | 250/492.21 |
| 6,101,536 | A |   | 8/2000  | Kotani et al.  |            |
| 6,501,081 | B1|   | 12/2002 | Foad et al.    |            |
| 7,573,051 | B2|   | 8/2009  | Goldberg       |            |
| 2005/0191409 | A1 | * | 9/2005 | Murrell et al. | 427/8 |

* cited by examiner

*Primary Examiner*—Nikita Wells
(74) *Attorney, Agent, or Firm*—Boult Wade Tennant (57) ABSTRACT

A guide tube for an ion beam in an ion implanter which is located adjacent a semiconductor wafer being implanted has an outwardly tapering central bore, thereby alleviating problems of beam strike as the ion beam passes through the guide tube.

13 Claims, 6 Drawing Sheets

ION BEAM GUIDE TUBE

FIELD OF THE INVENTION

The present invention relates to ion implanters, and in particular to the guide tube for an ion beam in an ion implanter which is located in the implanter adjacent a semiconductor wafer being implanted. Such guide tubes are provided primarily to confine charged particles used for wafer neutralization during implantation.

BACKGROUND OF THE INVENTION

When ion implantation is used in the fabrication of semiconductor devices, a problem can arise due to the accumulation of electrical charge at insulated locations over the surface of the semiconductor wafer being implanted. Excessive electrical charge at the surface of the semiconductor wafer can cause damage to the delicate structures being formed in the wafer, and can also have an effect on the implant process itself, especially when implanting ions at low energies.

It is therefore usual practice to provide arrangements for neutralizing charge build-up on the wafer surface during ion implantation. An arrangement for wafer neutralization during implantation is disclosed in U.S. Pat. No. 5,399,871. A guide tube is located in front of the wafer and the ion beam is directed through the guide tube to the wafer during implanting. A plasma generator associated with the guide tube provides a source of low energy electrons to the interior of the guide tube. In the case of the usual positive ion beam, electrostatic charge which can build up on the surface of the wafer being implanted is positive. The low energy electrons within the guide tube are attracted to any sites of positive electrostatic charge build up on the wafer surface, which are then neutralized.

Further developments in relation to charge neutralizing systems of the kind described above are disclosed in U.S. Pat. Nos. 6,101,536, 6,501,081 and U.S. Ser. No. 60/830,117, and these disclosures are incorporated herein in their entirety by reference. The neutralization system disclosed in these prior art documents is referred to in the art as a plasma flood system (PFS).

SUMMARY OF THE INVENTION

Against this background, the present invention resides in a guide tube for an ion beam in an ion implanter, for location in the implanter adjacent a wafer to be implanted to confine charged particles used for wafer neutralization during implantation, the guide tube comprising walls to define a central bore through the guide tube for allowing the ion beam's passage, wherein the walls are configured such that the central bore tapers.

Advantageously, provision of a tapering bore to the guide tube allows omission of an entrance aperture and/or an exit aperture that is narrower than the adjacent bore. For example, the guide tube need not be narrowed to present a step change in the size of the bore as it extends through the entrance and/or exit aperture. Any beam strike that may result within the bore is at grazing incidence to the tapering walls. This has been found to lessen the problem of beam strike causing particle contamination of the ion beam.

Optionally, the central bore may taper uniformly. Alternatively, the central bore may have a varying taper. Preferably, the central bore does not contain any step-changes in size.

Where the central bore is defined by a plurality of walls, each wall may be configured such that the bore tapers. Alternatively, only some of the walls may taper, for example an opposed pair of walls. This arrangement may be particularly beneficial when used with ribbon beams, where the guide tube may taper in the small axis direction of the ribbon beam.

Optionally, the guide tube may have a longitudinal axis and open ends to receive an ion beam along the longitudinal axis. A wall defining the central bore that is positioned substantially parallel with the longitudinal axis may be provided with at least one opening through the tube wall forming a gas conduction passage from inside to outside the guide tube, the passage having a length aligned at an acute angle to the longitudinal axis and a minimum dimension transverse to the length such that a line of sight through the passage perpendicular to the longitudinal axis is substantially occluded. Optionally, the passage is formed as a slot through the wall having a major dimension transverse to the passage length, which is transverse to the longitudinal axis.

A surface of the guide tube may be roughened, for example to provide surface features defined at least in part by sharp changes in orientation of adjacent parts of the surface. Preferably, the surface has been roughened to provide a series of grooves. The grooves may have a depth in a range of 0.1 mm to 10 mm, 0.25 mm to 7.5 mm, or 0.5 mm to 5 mm. Optionally, the portion of the surface may be roughened to provide a series of side-by-side grooves. The series may comprises grooves with a regular spacing in a range of: 0.1 mm to 10 mm, 0.25 mm to 7.5 mm, or 0.5 mm to 5 mm. The grooves may have any of the following cross-sectional profiles: v-shape, u-shaped, saw tooth or box-like trenches. The portion of the surface may be roughened to provide at least two intersecting series of grooves. The first series and second series may be disposed orthogonally, e.g. first and second series of v-shaped grooves may intersect to form an array of tetrahedra.

The present invention also resides in an ion implanter including any of the above described guide tubes. The guide tube may taper in the direction of ion beam travel through the ion implanter. Preferably, the guide tube tapers outwardly in the direction of travel of ion beam travel.

BRIEF DESCRIPTION OF THE DRAWINGS

Examples of the invention will now be described with reference to the following drawings in which.

DETAILED DESCRIPTION OF THE PREFERRED EMBODIMENTS

Figure 1:
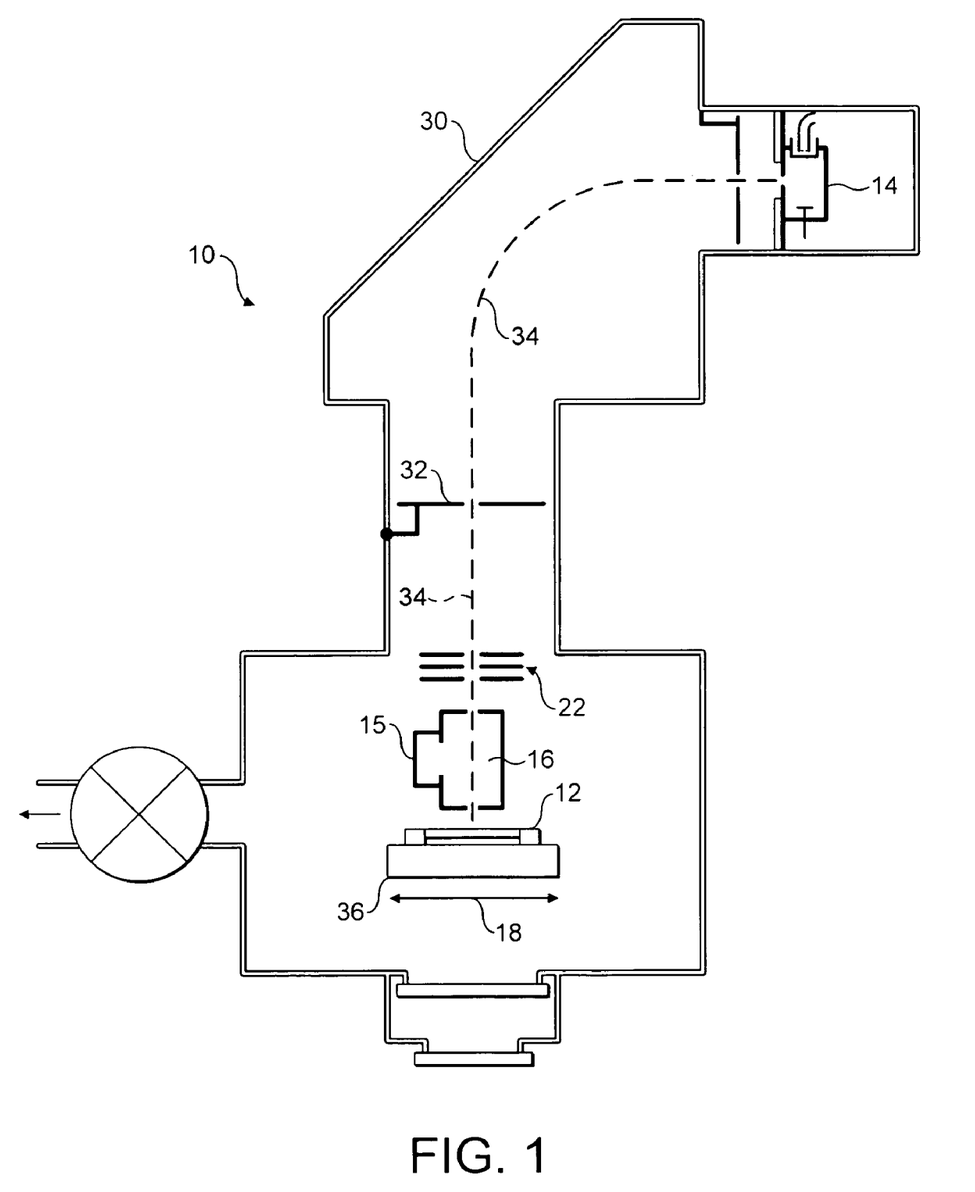
FIG. 1 is a simplified diagram of an ion implanter incorporating an embodiment of the present invention.

In FIG. 1, the illustrated ion implanter 10 comprises an ion source 14, from which ions are extracted including ions of the species required for implantation. The ion implanter 10 further comprises a mass analyzer 30 that includes a mass selection slit 32. The mass analyzer 30 ensures that essentially only ions of the desired species for implantation emerge through the mass selection slit 32 in a beam 34 towards a wafer 12 for implantation. All the elements of the ion implanter 10 are well known in this field and a typical arrangement known in the art is shown U.S. Pat. No. 5,969,366.

The ion source 14 produces a beam 34 of ions at a predetermined energy directed at the semiconductor wafer 12 mounted on a wafer holder 36. Typically, the cross-section or footprint of the ion beam 34 as it strikes the wafer 12 to be implanted is much smaller than the area of the wafer 12. Therefore, in order to ensure that all parts of the wafer 12 are dosed evenly with the required ions, the wafer holder 36 may be scanned, as illustrated by the arrows 18, so that all parts of the wafer 12 are equally exposed to the ion beam 34. The system for scanning the wafer 12 relative to the ion beam 34 may involve two-dimensional scanning of the wafer holder 36 past a fixed ion beam 34, two-dimensional scanning of the ion beam 34 over a fixed wafer 12, or combinations of these in which the ion beam 34 is scanned in one direction and the wafer 12 is moved in another direction. All forms of mutual scanning of the wafer 12 and ion beam 34 are contemplated in the present invention, although the invention is particularly useful in cases where the ion beam 34 is fixed and only the wafer 12 is scanned.

Usually the energy of the mass selected beam of ions 34 in an implanter 10 is 10 keV or greater. Energies lower than this can be produced, but such low energy beams can be difficult to transport through the mass analyzer 30, so that resulting low energy ion beams 34 can have very low ion current. However, it is often required to implant ions at energies of 1 keV or less. Accordingly, a deceleration lens assembly, shown generally at 22, may be located between the mass selection slit 32 and the wafer 12.

The deceleration lens assembly 22 comprises one or more electrodes biased to set up an electrostatic deceleration field in the region of the ion beam 34. The ion beam 34 passing through the deceleration lens assembly 22 may thus be decelerated to a lower energy for implantation. A suitable deceleration lens assembly 22 is described in detail in the aforementioned U.S. Pat. No. 5,969,366.

Immediately in front of the wafer 12 and downstream of the deceleration lens assembly 22, the ion implanter 10 has a wafer neutralization system indicated at 15. The wafer neutralization system 15 is intended primarily to provide low energy electrons and to confine these electrons to the region immediately in front of the wafer 12. These electrons can be attracted to any positively charged locations on the wafer 12 to prevent excess electric charge building up on the wafer 12 and the possibility of damage resulting from this charge. In addition, the wafer neutralization system 15 also serves to minimize field penetration from upstream electric fields towards the wafer 12, to size the ion beam immediately before it arrives at the wafer 12, and to reduce the conductance of gases outgassed from the wafer 12 back up the beamline.

Figure 2:
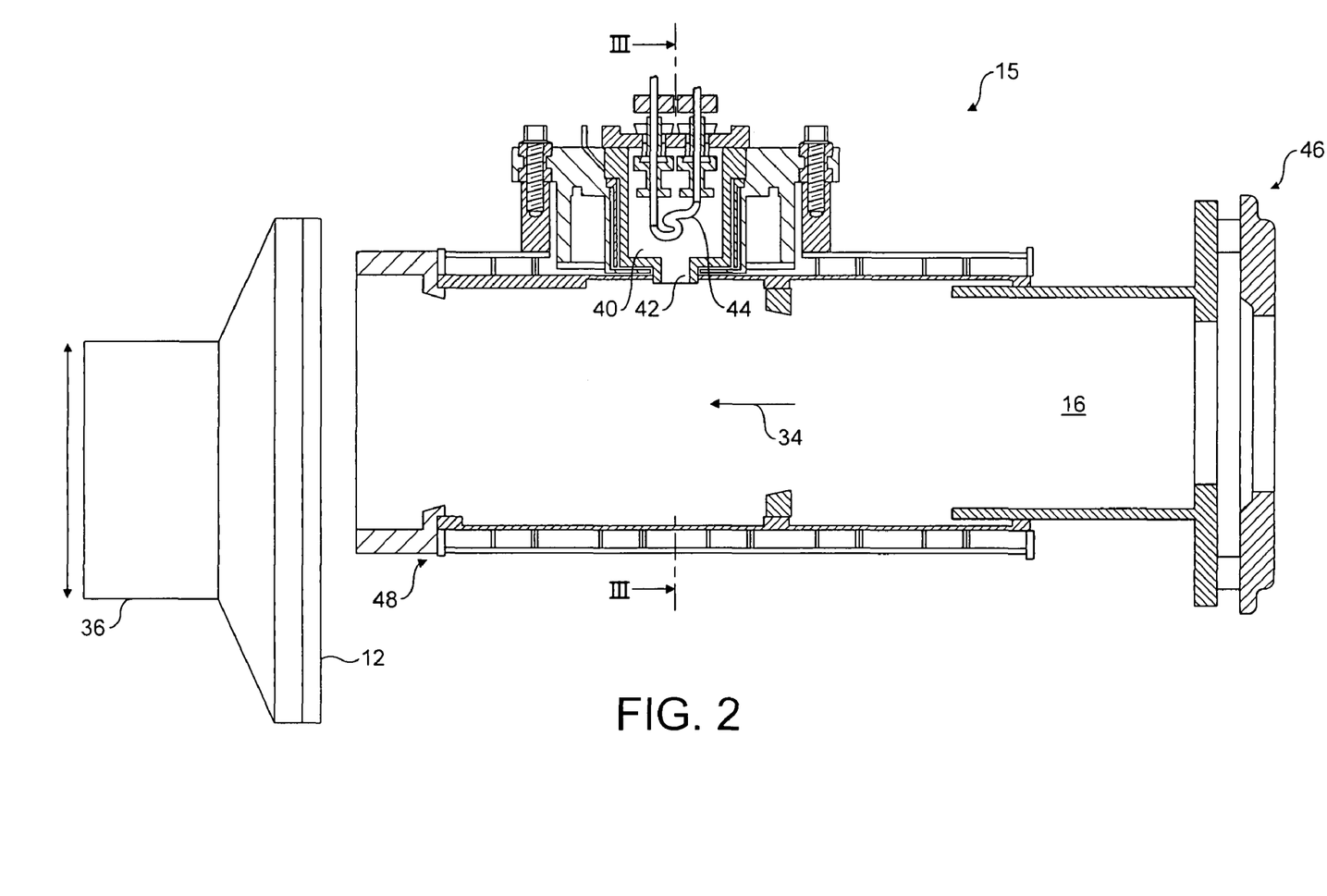
FIG. 2 is a cross-sectional view along the length of a prior art wafer neutralization system.
Figure 3:
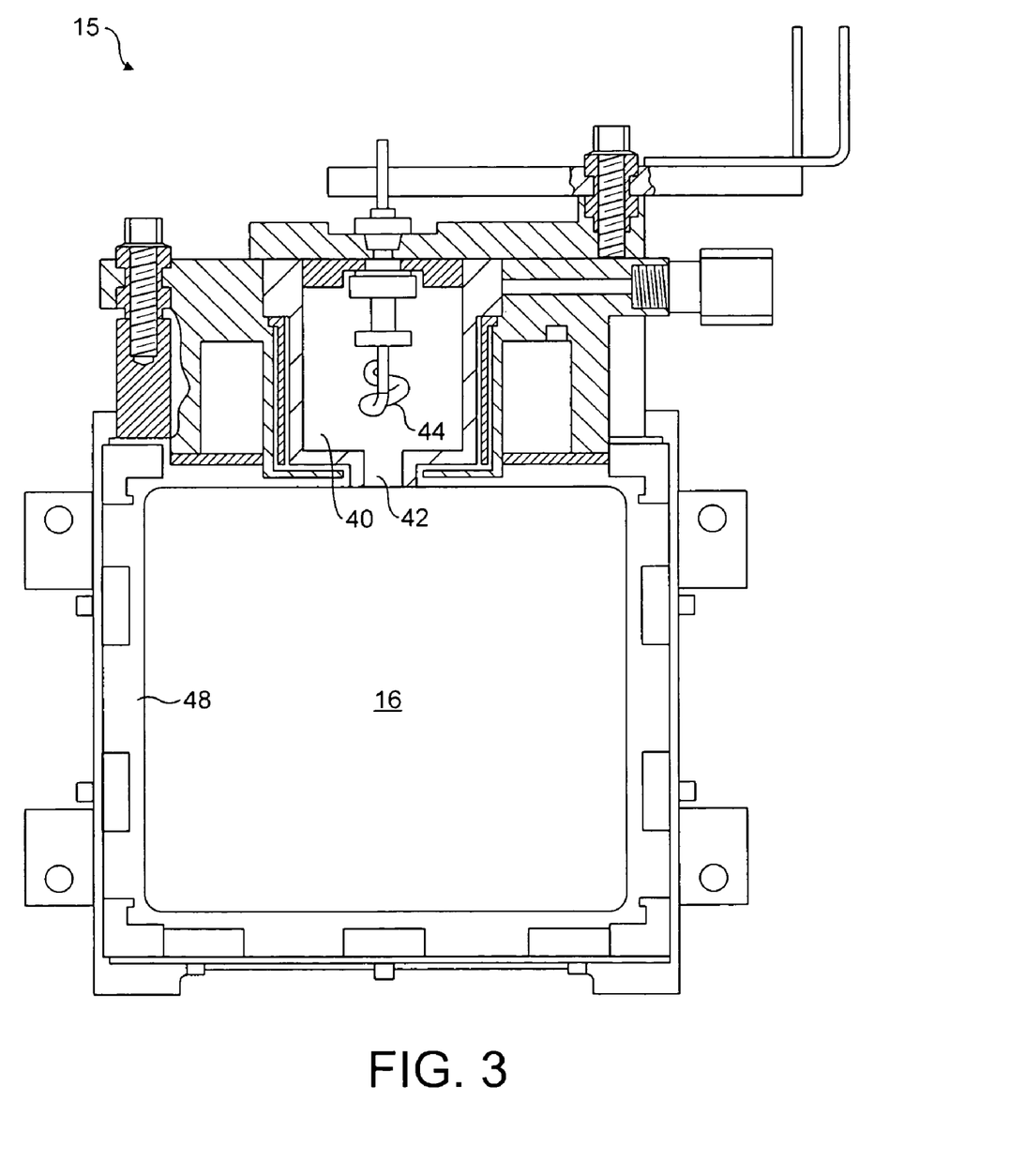
FIG. 3 is a cross-sectional view taken along line III-III of FIG. 2.

FIGS. 2 and 3 show a wafer neutralization system 15 according to the prior art. The wafer neutralization system 15 comprises a guide tube 16 which is open at each end so that the ion beam 34 can pass through the guide tube 16 generally parallel to the longitudinal axis of the guide tube 16. A plasma chamber 40 is provided fixed to a wall of the guide tube 16. An interior of the plasma chamber 40 communicates with the interior of the guide tube 16 through an opening 42. An inert gas such as argon is supplied to the plasma chamber 40 through line 43 and a plasma is formed by suitably biasing a heated cathode 44 relative to the walls of the plasma chamber 40. An abundance of electrons is produced in the plasma which can then emerge through the aperture 42 into the interior of the guide tube 16, for use in neutralizing any charge build up on the wafer 12 during implantation. Further details of a plasma flood system 15 of this type are given in the aforementioned U.S. Pat. No. 5,399,871, together with U.S. Pat Nos. 6,101,536 and 6,501,081.

The guide tube 16 is effective to confine low energy electrons produced by the plasma chamber 40 within the interior of the guide tube 16, so that they are available for neutralizing positive charge build up on the wafer 12. For this purpose the guide tube 16 may be held at a small negative potential.

Although a particular form of PFS type neutralizing system 15 has been described, any neutralizing system 15 can be used with embodiments of the invention, where the neutralizing system 15 employs a guide tube generally similar to guide tube 16, for the purpose of confining neutralizing electrons around the ion beam 34 and in front of the wafer 12 being implanted.

The guide tube 16 comprises an entrance aperture 46, defined by a post acceleration system in this embodiment. However, the guide tube may be preceded by a variety of structures, including (i) a post acceleration system, (ii) a deceleration lens assembly, or (iii) a focus lens such as an Einzel lens. Alternatively, the entrance aperture may be specific to the guide tube 16 and so function only to limit the size of the ion beam 34 entering the guide tube 16. In this last case, the guide tube may be preceded by a magnet or other deflecting element or it may be preceded only by a mass selection slit 32 of the mass analyzer 30.

The narrowed aperture 46 is susceptible to beam strike, and so presents a significant source of particle contamination. An exit aperture 48 formed by a narrowing in the guide tube 16 is also susceptible to beam strike and so contributes to particle contamination, this being particularly significant due to the closeness of the exit aperture 48 to the wafer 12.

Figure 4:
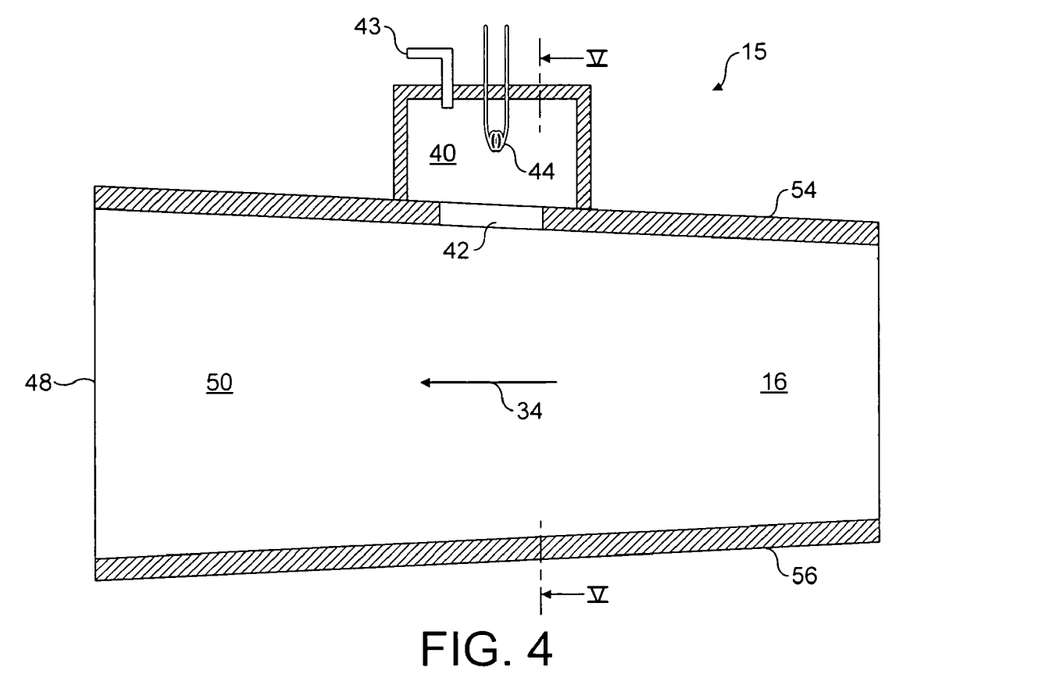
FIG. 4 is a schematic sectional view along the length of a wafer neutralization system including a guide tube according to an embodiment of the present invention.
Figure 5:
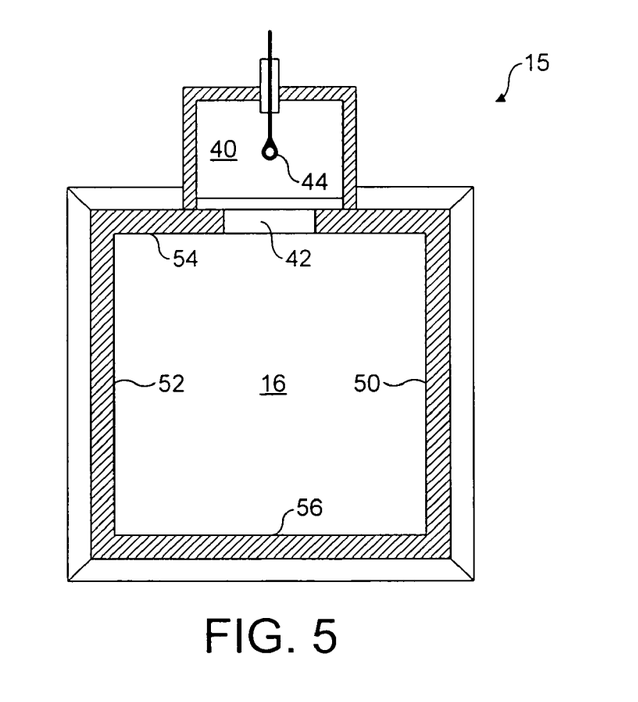
FIG. 5 is a schematic sectional view taken along line V-V of FIG. 4.

FIGS. 4 and 5 show a guide tube 16 according to a first embodiment of the present invention. To overcome the problem of beam strike on the entrance and exit apertures 46 and 48 found in prior art guide tubes 16, these narrowed apertures have been omitted. Instead, a guide tube 16 having plain ends 46 and 48 is formed. Instead, the guide tube 16 has a tapering form. All four walls 50-56 of the guide tube 16 taper outwardly along the direction of travel of the ion beam 34 such that the downstream end 48 of the guide tube 16 is widened relative to the upstream end 46. In common with prior art designs, the walls 50-56 are either made from graphite or are fitted with graphite liners.

Arrow 34 indicates that the direction of travel of the ion beam 34 through the guide tube 16. The ion beam 34 will tend to diverge as it travels through the guide tube, for several reasons. First, space charge effects cause the ion beam size to blow up. Second, the ion beam is usually focused at a point upstream of the guide tube 16 (e.g. at the mass selection slit 32), and the ion beam 34 diverges after this point.

As the ion beam 34 is diverging, there is a chance that the ion beam 34 may strike the internal surfaces of the walls 50-56 that define the bore through the guide tube 16. However, as the size of the downstream end 48 is similar to that of prior art exit apertures 48, no increase in beam strike is seen. Moreover, the beam strike is made at grazing incidence in the guide tube 16 of FIGS. 4 and 5, and this has been found to reduce the problem of particle contamination in the ion beam 34. The size of the upstream end 46 may be increased relative to the typical size of entrance apertures 46 in prior art guide tubes 16. However, there may be other reasons why this increase in size is limited, for example due to requirements in the electrical field produced at the upstream end 46 of the guide tube 16.

Figures 6A, 6B:
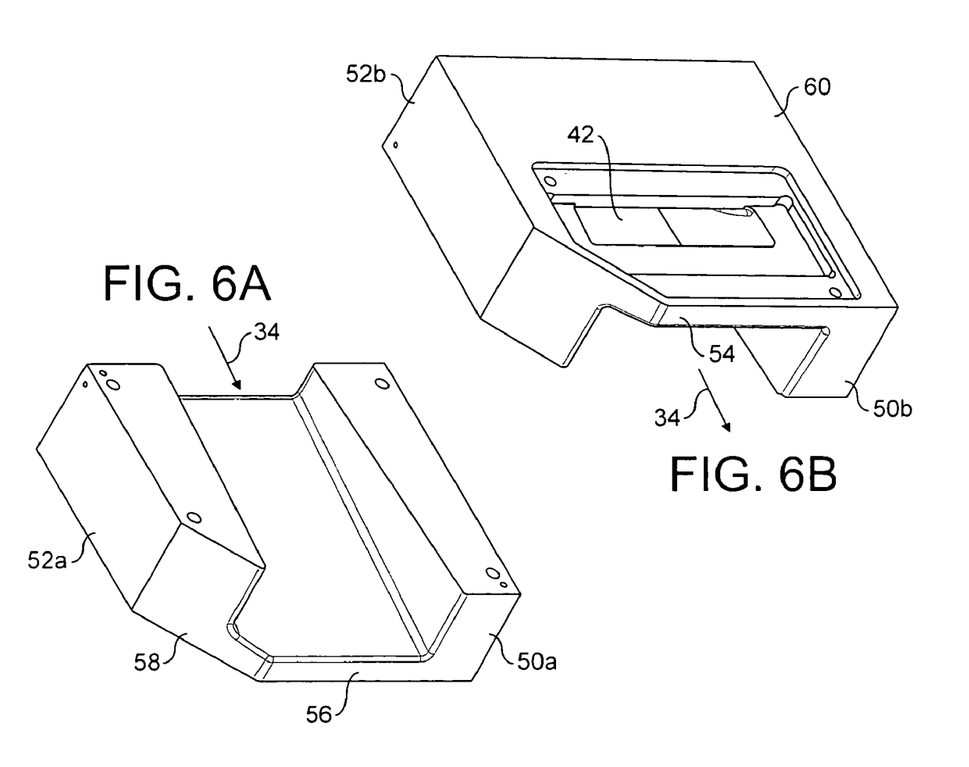
FIGS. 6a to 6c are perspective views of first and second components that may be assembled to form a guide tube according to an embodiment of the present invention, with FIG. 6a corresponding to a perspective view of the first component from above and to the left looking upstream, FIG. 6b corresponding to a perspective view of the second component taken from above and to the left looking upstream, and FIG. 6c corresponding to a perspective view of the second component flipped over relative to FIG. 6b.
Figure 6C:
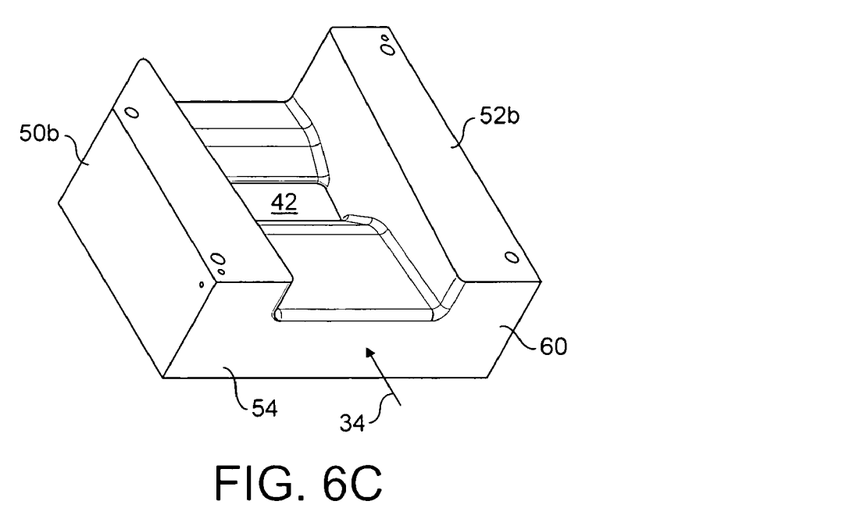

FIGS. 6a to 6c show how the guide tube 16 of FIGS. 4 and 5 may be comprised of two components, a first, lower component 58 and a second, upper component 60. The lower component 58 forms the lower wall 56 of the guide tube 16, and the lower halves of the side walls 50 and 52, indicated as 50a and 52a in FIG. 6a. The upper component 60 forms the upper wall 54, and the upper halves of the side walls 50b and 52b. The upper component 60 is also provided with the aperture 42 that will communicate with plasma chamber 40 when fastened to the upper component 60. The upper and lower components 60 and 58 may be joined in any number of conventional ways, e.g. fixed together with bolts. As will be clear, the components 58 and 60 join to form a guide tube 16 that has uniform external dimensions (unlike the guide tube 16 shown in FIGS. 4 and 5), but whose walls 50-56 are formed such that the inner bore they define tapers outwardly along the direction of travel of the ion beam 34 (in common with FIGS. 4 and 5).

Figure 7:
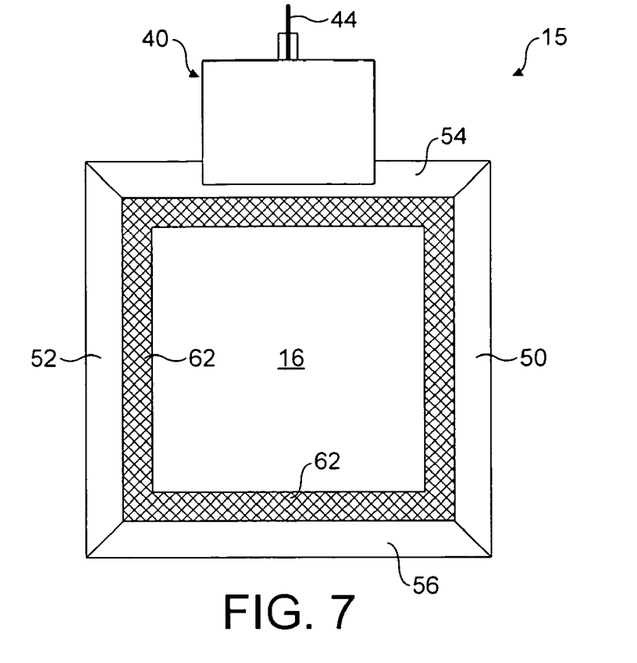
FIG. 7 is an end view of a wafer neutralization system including a guide tube according to a further embodiment of the present invention, taken looking downstream.
Figure 8:
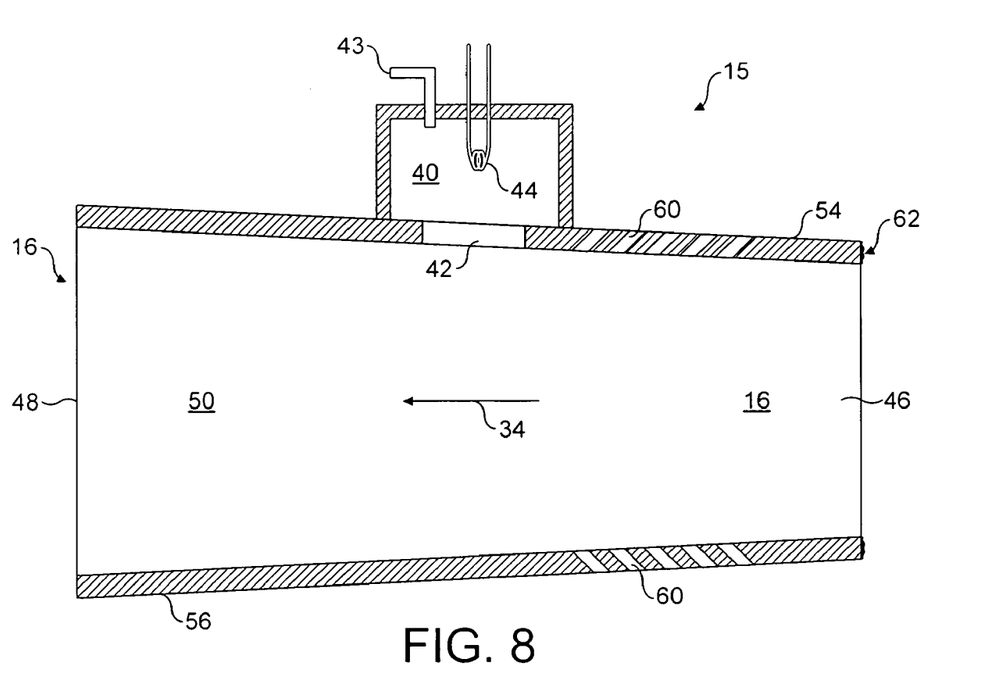
FIG. 8 is a schematic sectional view along the length of the wafer neutralization system of FIG. 7.

FIGS. 7 and 8 show a guide tube 16 according to a further embodiment of the present invention. This embodiment corresponds broadly to the embodiment of FIGS. 4 and 5, save for the following additional features. The walls 50-56 are provided with a series of angled slots 60. In addition, the upstream end 46 of the guide tube 16 is provided with a roughened surface 62. The reasons for these additions will now be described.

As noted above, the neutralizing system 15 may be preceded by a deceleration lens assembly 22. If there are any neutral atoms in the ion beam 34 as it passes through the deceleration lens assembly 22, these neutrals are not decelerated. Such neutrals may travel through the guide tube 16 at energies above the decelerated energy of the ion beam 34 and may then be implanted at this higher energy in the wafer 12. Such energy contamination of the wafer 12 is undesirable and steps are taken to ensure that the number of neutrals in the region of the deceleration lens assembly 22 is minimized.

It has been found that neutral contamination can be reduced by providing the angled slots 60 through the walls 50-56 of the guide tube 16. As seen in FIG. 8, the slots 60 extend through the thickness of the walls 54 and 56 (and, although not shown, walls 50 and 52). Each of the slots 60 has a length (extending between the interior and the exterior of the guide tube 16) which is aligned at an acute angle to the guide tube's longitudinal axis. Further, each of the slots 60 has a minimum dimension, which corresponds to the widths of the slots 60, which is sufficiently small so that there is no line of sight from the interior to the exterior of the guide tube 16 in directions perpendicular to the longitudinal axis of the guide tube 16. Importantly, the slots 60 are angled in directions outwards and away from the wafer 12, at the left hand end of the guide tube 16 as shown in FIG. 8. In this way, atoms and molecules outgassing from the wafer 12 during implantation (typically from the masking materials or resist applied to the wafer 12 prior to an implantation process) can more readily escape from the interior of the guide tube 16 by passing through the slots 60. Angling the slots 60 outwards and away from the surface of the wafer 12 allows resist gases to escape more easily.

Furthermore it will be appreciated that the feed 43 of inert (argon) gas to the interior of the plasma chamber 40 can result in an elevated residual gas pressure within the interior of the guide tube 16. The passages 60 also provide a conduction path for the escape of this gas.

Thus, the amount of gas exiting the upstream end 46 of the guide tube 16 is reduced. In turn, this provides a reduced gas loading of the region of the deceleration lens assembly 22. Consequently, there is a reduced probability of ions in the ion beam 34 being neutralized by a collision event with a residual gas molecule and energy contamination of the ion beam 34 passing through the guide tube 16 to the wafer 12 is reduced.

Although the advantage of the slots 60 in the guide tube 16 can be most significant for a decelerated ion beam 34, advantages are also obtained when used in an ion implanter 10 with no deceleration lens assembly 22, or when the deceleration lens assembly 22 is not biased to decelerate the ion beam 34. Then, by reducing the residual gas pressure along the ion beam path following the mass analyzer 30, the number of neutrals produced in the ion beam 34 may be reduced, so that the total ion beam current can be measured more easily.

Slanting the slots 60 through the guide tube walls 50-56 has a number of advantages. First, the slots 60 are slanted away from the wafer 12 being implanted so that outgassing material from the wafer 12 can more readily pass along the slots 60 to the exterior of the guide tube 16. Second, slanting the slots 60 and controlling their width reduces the radiation of heat from within the guide tube 16. This can be particularly important in preventing overloading of sensitive equipment in the process chamber surrounding the wafer 12 and the neutralization system 15, such as a cryo pump used for maintaining the vacuum in this region. Third, the acutely angled slots 60 prevent substantial distortion of the electrostatic field within the guide tube 16 required to confine low energy electrons for wafer neutralization.

A further advantage can arise if there is a tendency for the interior of the guide tube 16 to become coated, for example with outgassed resist material. Such coating may be dielectric and result in impairment of the electron confinement field produced by the guide tube 16. The slots 60 have a significant length between the interior and the exterior of the guide tube 16, which is increased as a result of the acute angle of the slots 60. The probability of at least some portions of the surface of the interior of the guide tube 16, including the interior walls of the slots 60, remaining free of insulating coating is increased.

As an alternative to the slots 60 of FIG. 8, the walls 50-56 of the guide tube 16 may comprise multiple angled slats. These slats may be mounted between corner posts forming a framework for the guide tube 16.

Further details of such arrangements may be found in U.S. patent application Ser. No. 11/822,738, now U.S. Pat. No. 7,573,051, the contents of which are incorporated herein in their entirety by reference.

As noted above, beam strike on the guide tube 16 may cause particle contamination, and this is exacerbated if the ion beam 34 strikes the guide tube 16 at an oblique angle. While the problem is markedly reduced by omitting the exit aperture at 48 of FIG. 2, the upstream end 46 of the guide tube 16 still presents a face 62 that may be struck obliquely by the ion beam 34. To alleviate the problem of particles being sputtered from that face 62, the face 62 is roughened. This may be achieved by forming a series of grooves in the face 62. In FIG. 7, the roughening is shown to be a series of intersecting grooves that form an array of tetrahedra. Such roughening is useful as it resists formation of large deposits of material on the face 62. For example, particles such as graphite entrained within the ion beam 34 may be deposited on the face 62, only to be sputtered off at a later time. These deposits may accumulate, and may then later delaminate as large flakes of material that can be very damaging to the structures being formed on the wafers 12 being implanted.

While FIG. 7 shows only face 62 being roughened in this way, other surfaces adjacent the ion beam 34 may be roughened in similar fashion, for example the internal surfaces of the walls 50-56 of the guide tube 16.

Further details of such arrangements may be found in U.S. patent application Ser. No. 11/651,107, now abandoned, the contents of which are incorporated herein in their entirety by reference.

While the embodiment of FIGS. 7 and 8 combine the use of slots 22 and surface roughening, either of these two ideas may of course be used on their own. The skilled person will appreciate that other variations can be made to the above embodiments without departing from the scope of the present invention.

For example, the taper of the guide tube 16 may be varied to achieve the desired electric field shape. Manipulation of the shape, the resulting electric field and its effect on the ion beam are readily achievable, for example through use of software packages such as Simion®. While the guide tubes 16 shown adopt a constant taper along their length, this need not be the case. Varying tapers, or even sections having no taper, may be used. In addition, not all of the walls 50-56 need be tapered. For example, only a pair of walls may taper.

The invention claimed is:

1. An ion implanter which includes a wafer to be implanted and a guide tube adjacent the wafer for confining charged particles used for wafer neutralisation during implantation, the guide tube comprising one or more walls to define a central bore through the guide tube for allowing the ion beam's passage, wherein the one or more walls are configured such that the central bore tapers.

2. The ion implanter of claim 1, wherein the guide tube has plain ends such that the guide tube lacks an entrance aperture and/or an exit aperture that is narrower than the adjacent bore.

3. The ion implanter of claim 2, wherein the guide tube smoothly tapers so as not to present a step change in the size of the central bore as it extends through the entrance and/or exit aperture.

4. The ion implanter of claim 3, wherein the guide tube smoothly tapers so as not to present a step change in the size of the central bore anywhere along its length.

5. The ion implanter of claim 1, wherein the central bore tapers uniformly.

6. The ion implanter of claim 1, wherein the central bore is defined by a plurality of walls, each wall being configured such that the bore tapers.

7. The ion implanter of claim 1, wherein the guide tube has a longitudinal axis, open ends to receive an ion beam along the longitudinal axis, wherein a wall defining the central bore that is positioned substantially parallel with the longitudinal axis is provided with at least one opening through the tube wall forming a gas conduction passage from inside to outside the guide tube, the passage having a length aligned at an acute angle to the longitudinal axis and a minimum dimension transverse to the length such that a line of sight through the passage perpendicular to the longitudinal axis is substantially occluded.

8. The ion implanter of claim 7, wherein the passage is formed as a slot through the wall having a major dimension transverse to the passage length, which is transverse to the longitudinal axis.

9. The ion implanter of claim 1, wherein a surface of the guide tube is roughened.

10. The ion implanter of claim 9, wherein the surface has been roughened to provide a series of grooves.

11. The ion implanter of claim 10, wherein the portion of the surface has been roughened to provide two series of intersecting side-by-side grooves.

12. The ion implanter of claim 1, wherein the guide tube lacks an entrance aperture and/or an exit aperture that is narrower than the adjacent bore.

13. The ion implanter of claim 1, wherein the ion implanter tapers outwardly in the direction of ion beam travel through the ion implanter.

* * * * *